US005510273A

United States Patent [19]

Quinn

[11] Patent Number: 5,510,273
[45] Date of Patent: Apr. 23, 1996

[54] PROCESS OF MOUNTING SEMICONDUCTOR CHIPS IN A FULL-WIDTH-ARRAY IMAGE

[75] Inventor: Kraig A. Quinn, Webster, N.Y.

[73] Assignee: Xerox Corporation, Stamford, Conn.

[21] Appl. No.: 415,811

[22] Filed: Apr. 3, 1995

[51] Int. Cl.⁶ ............... H01L 21/56; H01L 21/58; H01L 21/603; H01L 21/70
[52] U.S. Cl. ............... 437/3; 437/53; 437/205; 437/212; 437/214; 437/216; 437/249
[58] Field of Search ............... 437/3, 53, 205, 437/212, 214, 216, 249

[56] References Cited

U.S. PATENT DOCUMENTS

| | | | |
|---|---|---|---|
| 3,811,186 | 5/1974 | Larnerd et al. | 29/626 |
| 4,814,296 | 3/1989 | Jedlicka et al. | 437/226 |
| 5,093,708 | 3/1992 | Solomon | 357/68 |
| 5,153,421 | 10/1992 | Tandon et al. | 250/208.1 |
| 5,258,330 | 11/1993 | Khandros et al. | 437/209 |
| 5,272,113 | 12/1993 | Quinn | 437/205 |
| 5,286,679 | 2/1994 | Farnworth et al. | 437/209 |
| 5,318,926 | 6/1994 | Dlugokecki | 437/210 |

FOREIGN PATENT DOCUMENTS 277143  3/1990  Japan.

Primary Examiner—George Fourson
Assistant Examiner—David E. Graybill
Attorney, Agent, or Firm—R. Hutter

[57] ABSTRACT

A process for manufacturing semiconductor chips, such as photosensor arrays for a full-page-width scanner or printhead chips for a full-page-width ink-jet printer, mounted on a substrate to maintain reasonably consistent spacing among adjacent chips. Before chips are tacked onto the substrate with uncured epoxy, the substrate is urged evenly against a work surface defining a concave bow. The radius of curvature of the concave bow is calculated as a function of the desired spacing between adjacent chips. When the substrate having chips tacked thereon is released form the work surface, neighboring chips have parallel adjacent surfaces of the desired spacing.

5 Claims, 3 Drawing Sheets

PROCESS OF MOUNTING SEMICONDUCTOR CHIPS IN A FULL-WIDTH-ARRAY IMAGE

The present invention relates generally to semiconductor chips which are mounted on a substrate. In particular, the present invention relates to a method whereby semiconductor chips are mounted on a substrate.

Image sensors for scanning document images, such as charge coupled devices (CCDs), typically have a row or linear array of photosites together with suitable supporting circuitry integrated onto a silicon chip. Usually, a sensor is used to scan line by line across the width of a document with the document being moved or stepped lengthwise in synchronism therewith. A typical architecture for such a sensor array is given, for example, in U.S. Pat. No. 5,153,421.

In a full-page-width image scanner, there is provided a linear array of small photosensors which extends the full width of an original document, such as 11 inches. These photosensors may be spaced as finely as 600 to the inch on each chip. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are typically approximately ¾ inches in length; in order to create a practical full-page-width array, as many as twenty or more of these chips can be abutted end-to-end to form a single linear array of photosensors. The abutted chips are typically mounted on a support platform. This support platform also includes circuitry, such as on a printed wire board, which accesses the circuit devices on the individual chips for a practical system. The interconnections between the relatively large-scale conductors on the printed wire board and the relatively small contact pads on the semiconductor chips are preferably created by wire bonds which are ultrasonically welded to both the printed wire board conductors and to contact pads on the chips.

In a scanning system, the image resolution is proportional to the ratio of the scan width and the number of array photosites. Because of the difficulty in economically designing and fabricating an array of photosites comparable in length to the width of an image, optical reduction of the scan line to a length considerably shorter than the actual width of the image is fairly common in scanners and facsimile machines currently available. Because of the optical reduction, image resolution typically available today is relatively low when used to scan a full line. A long or full-width array having a length equal to or larger than the document line and with a large packing of co-linear photosites to assure high resolution has been and remains a very desirable but difficult aim. In the pursuit of a long or full-width array, forming the array by assembling several small chips together end to end has often been postulated. However, the need, which is critical, to provide chips with photosites extending to the border or edge of the chip, so as to assure continuity when the set of chips are assembled into a full-width array, and at the same time provide edges that are sufficiently smooth and straight to be assembled together without loss of image data, has proven to be a formidable obstacle. Although the standard technique of scribing and cleaving silicon wafers used by the semiconductor industry for many years produces chips having reasonably controlled dimensions, the microscopic damage occurring to the chip surface during the scribing operation effectively precludes the disposition of photosites at the chip edge. Various techniques have been proposed in the prior art for cleaving wafers into chips in a manner that preserves the accuracy of dimensions and avoids damage to the chips. One example of such a technique, incorporating the chemical etching of V-shaped grooves prior to the sawing step, is shown in U.S. Pat. No. 4,814,296.

In the prior art, U.S. Pat. No. 3,811,186 discloses a method for aligning and supporting micro-circuit devices on substrate conductors, in which shaped, flexible, insulative material is placed between the devices and their respective conductors to support heat fusible terminals of the devices in alignment with mating conductor lands.

U.S. Pat. No. 5,093,708 discloses a multilayer integrated circuit module for supporting integrated circuit chips and interfacing the chips to external circuitry. Each integrated circuit includes conductive contact pads disposed upon beveled edges. Beveled side edges formed in the circuit module support the integrated circuit chips upon the beveled surfaces thereof.

U.S. Pat. No. 5,258,330 discloses a semiconductor chip having contact on the top surface thereof and including an interposer overlying the central portion of the top surface. Peripheral contact leads extend inwardly from the peripheral contact to central terminals on the interposer. The leads, and preferably the interposer, are flexible so that the terminals are movable with respect to the contacts on the chip, to compensate for differential thermal expansion of the chip and substrate.

U.S. Pat. No. 5,272,113 discloses a method for making a photosensor array comprising a plurality of abutting silicon chips. After chips are tacked onto a substrate with uncured epoxy, the assembly is brought to a low temperature prior to the heating of the curing step. As mentioned in this patent, the size of a gap between abutting chips is determined by taking into account the difference in thermal coefficents of expansion between the chip material and the substrate material, as well as the temperature range in which the array is stored and operated and the operational temperature gradient between the chip array and the substrate. Also, the maximum allowable size of the gap is dictated by the desired image quality of the array.

U.S. Pat. No. 5,318,926 discloses a method of re-configuring a plastic package so that an integrated circuit chip can be installed therein. A pre-molded plastic package is abraded over a die attach pad. A new chip is then mounted onto the mounting pad and new wire bonds are connected between the new chip and the lead frame.

U.S. Pat. No. 5,286,679 discloses a method for attaching a semiconductor die to a lead frame, comprising the steps of forming a pattern adhesive layer on a semiconductor wafer prior to singulation of the dies from the wafer. The adhesive layer is patterned such that wire bonding pads on the dies, as well as the streets between the dies, are free of adhesive material.

According to the present invention, there is provided a method of assembling a chip array having a plurality of chips spaced a predetermined distance from one another. A flexible substrate is provided. The flexible substrate is urged evenly against a work surface, the work surface defining a concave bow causing the flexible substrate to assume a predetermined radius of curvature. A plurality of chips are tacked onto the substrate with an adhesive, the chips arranged in a line whereby top corners of adjacent surfaces of adjacent chips contact each other.

BRIEF DESCRIPTION OF THE DRAWINGS

FIG. 1 shows a substrate 10 having a plurality of butted silicon chips 12a, 12b, . . . 12z mounted thereon. Although the chips 12a–12z shown in the Figure are not specified as to function, it will be understood that they each may represent a portion of a CCD, another type of photosensitive semiconductor chip, an LED (light-emitting diode) print bar, a chip relating to ink-jet technology, or any other purpose in which a series of semiconductor chips are required to be arranged in butted fashion. At the side interfaces between adjacent chips 12 on the substrate 10, are preferably formed back-cuts 13. Back-cuts 13 are open-ended grooves having the open ends thereof disposed adjacent the surface of substrate 12, and serve to provide narrow cavities between the adjacent chips and the substrate 10. Such back-cuts are shown, for example, in U.S. Pat. No. 4,814,296. In one typical application of butted chips on a substrate, the chips 12a–12z are of a thickness of approximately 17 mils, with back-cuts at the edges thereof so that the thickness of each chip in the area of a back-cut is about 6 mils. The cavities formed by back-cuts 13 are useful, among other reasons, for receiving excess quantities of adhesive placed on the substrate 10 and pressed out from under the chips in the array assembly process, as will be explained below.

Also defined on each chip 12a, 12b, . . . 12z is a set of repetitive structures 14. As used herein, "repetitive structure" relates to any regularly-spaced devices or structures on each chip which form a regular pattern. These structures may be, by way of example and not limitation, photosites in a CCD, LED's, or capillary channels or resistors in portions of thermal ink-jet printheads. As mentioned above, the regular spacing of such repetitive structures is usually crucial to maintain on a chip-to-chip basis, particularly in the gaps between adjacent chips.

For most semiconductor applications, the most common primary material for chips 12a–12z is crystalline silicon. A preferred substance for forming substrate 10 is the board sold under the tradename "CERACOM", made by Ibiden Corporation of Japan, which generally comprises a ceramic core with a fiberglass resin laminate thereon. Another material suitable for substrate 10 includes the printed wire board material known as "FR-4," or a relatively thin substrate of alumina.

Figure 2:
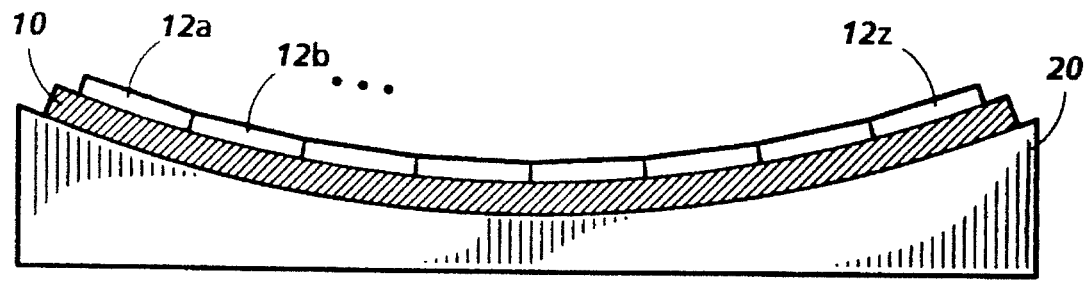
FIG. 2 is an elevational view of a chip array at one stage in the construction thereof, wherein the substrate is urged against a work surface having a concave bow.

FIG. 2 is an elevational view showing the substrate 10, with chips 12 tacked thereon, at one stage in the manufacturing process thereof. As can be seen in the Figure, the substrate 10 is urged evenly along its length against a workpiece 20, which defines a concave bowed work surface thereon. This urging may be performed with an arrangement of vises, clamps, or vacuum (not shown), as would be apparent to one skilled in the art. The urging of the substrate 10 against the work surface causes the top surface of substrate 10 (defined herein the surface of substrate 10 on which chips 12 are to be placed) to assume a concave bow as well.

When the substrate 10 is urged against the work surface, silicon chips 12a . . . 12z are placed on the concave-bowed surface of substrate 10. Typically, the chips are first tacked into general position with an adhesive such as epoxy, and this epoxy is cured in a subsequent heating process. In the tacking step, however, the chips 12 are placed on the concave surface of substrate 10 and pushed together to form an array. Because the entire surface of substrate 10 is curved, while the corresponding surfaces of the chips 12 remain planar, it will be apparent that the surfaces of the chips 12 in tacked contact with substrate 10 do not exactly conform to the shape of the surface of substrate 10.

Further, the straight chips 12 placed on the curved surface of substrate 10, even when they are pushed together, will contact each other only at the top corners thereof. As used in the specification and claims herein, the surface of each individual chip 12 opposite the surface in general contact with the substrate 10 will be referred to as the top surface of the chip, and the corners along the top surface of the chip will be known as the top corners. This convention is used for convenience only, and does not imply that a particular orientation of the assembly is necessary. Thus, in general, each individual silicon chip 12 will contact the surface of substrate 10 only at the bottom corners thereof along the length of the array formed by the chips, and will contact adjacent chips in the array only at top corners thereof.

Figure 1:
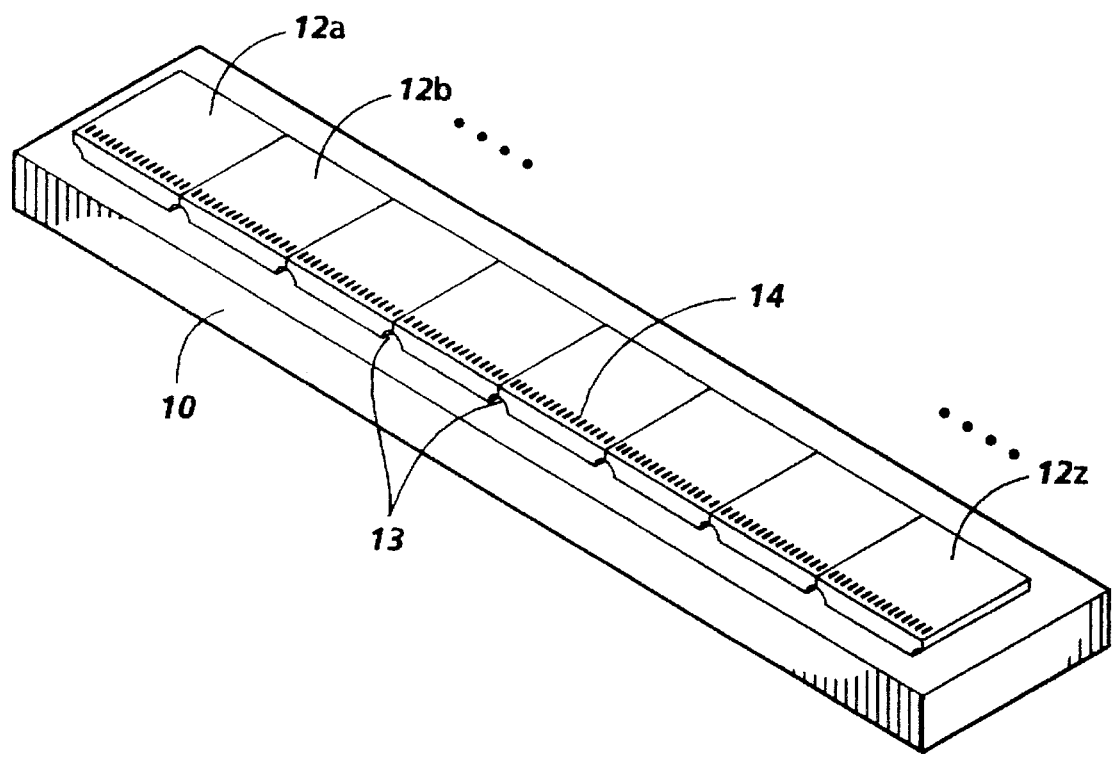
FIG. 1 is a perspective view of a chip array, such as would be used in a full-page-width photosensor array or ink-jet printhead, wherein abutted silicon chips are attached to a substrate.
Figure 3:
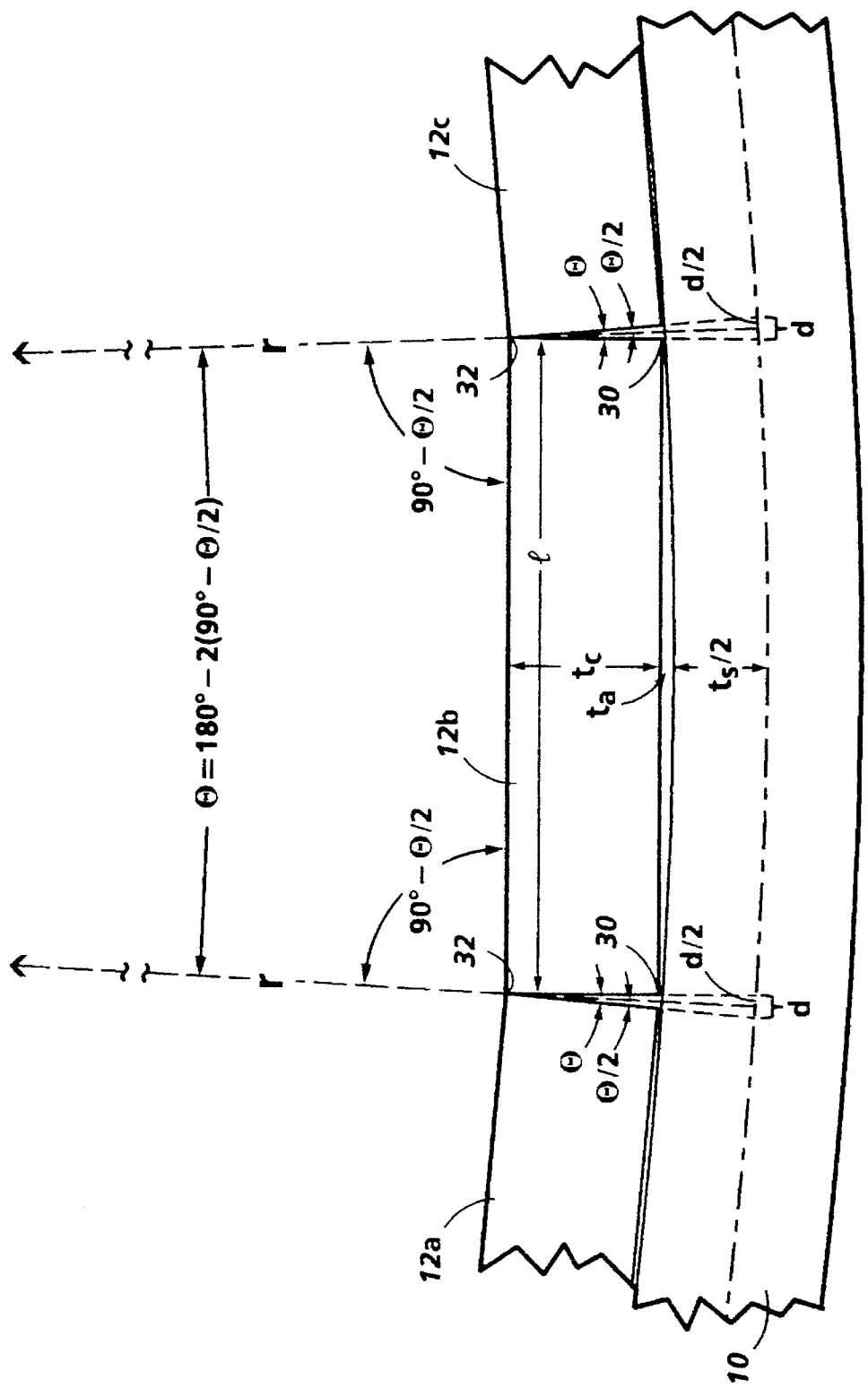
FIG. 3 is a detailed view showing the relationship between adjacent silicon chips when the substrate is urged against the work surface.

FIG. 3 is a detailed view showing three silicon chips 12a, 12b, and 12c, showing in detail the relationships of the chips to the curved surface of substrate 10 as the substrate 10 is urged against the concave work surface of workpiece 20. In order to clearly illustrate the relationship of parts, the back-cuts 13 shown in FIG. 1, which are used to accept excess adhesive, are not apparent in FIG. 3. The technique of the present invention for obtaining the desired space d between adjacent chips is valid whether or not such back-cuts are present in the chips. An excess of adhesive can be avoided by applying the adhesive 18 in a discontiuous bead along substrate 10, so that no adhesive is apparent in the gaps between adjacent chips.

A chip such as 12b is in closest contact with substrate 10 only at the bottom corners thereof, shown as 30, and contacts the adjacent chips 12a and 12c only at the top corners thereof, indicated as 32. Significantly, it will be noticed that the gap between, for example, chip 12a and 12b on the curved surface of substrate 10 forms a general wedge shape, with the gap between the chips being relatively large toward the bottom of the chips and tapering to nothing at top corner 32 of either chip. Once the substrate 10 is stopped being urged against the concave surface of workpiece 20 and allowed to reassume its natural straight shape, the chips tacked onto the newly-straight substrate 10 will not have wedge-shaped gaps therebetween, as in FIG. 3, but rather will have parallel edges, and be spaced apart precisely by the distance d projected on the plane at one-half the thickness of substrate 10 when the substrate 10 is caused to be curved. This fact can be used to provide precise spacing between the chips such as 12a and 12b in the final product, such as, for example, a full-page-width photosensor array or ink-jet printhead.

In order to obtain a precise spacing d between adjacent chips in a chip array, the curvature of the work surface can be calculated for a desired space d between the chips. FIG. 3 shows a set of base lines, disclosed as dotted lines, which show how a radius of curvature for the center plane of the substrate 10 can be calculated in order to yield the desired value of d to create the desired spacing in the finished product when the substrate 10 is allowed to reassume its natural straight shape. The radius of curvature r can be calculated taking into account the desired spacing d between adjacent chips, the thickness of the chips, the thickness of the adhesive between the chips, and the effective thickness of the substrate 10.

By "effective thickness" is meant that when the substrate 10 is urged against the concave bowed surface of workpiece 20, the portion of the substrate immediately adjacent the work surface will be caused to stretch, while the portion of the substrate 10 away from the work surface will be caused to compress. In order to perform the correct calculation to obtain the desired value of d the plane of interest within substrate 10 is the plane at one-half the thickness of the substrate 10. It is generally assumed that the portion of the substrate 10 above the neutral plane of substrate 10 will experience compression, while the portion of the substrate below the neutral plane will be stretched. Given these known values of the dimensions of the substrate and chips, and the desired value of d, the radius of curvature r of the work surface of workpiece 20 can be calculated thus:

$$r = \frac{l[t_c + t_a + (t_s/2)]}{d}$$

where:

r = the temporary radius of curvature
l = the chip length
$t_c$ = the chip thickness
$t_a$ = the adhesive thickness under chips
$t_s$ = the thickness of the substrate
d = the gap distance between chips Because it is assumed that many identical chip arrays will be made in a manufacturing process, one need only make a single workpiece 20 which creates the desired radius of curvature of the substrate 10, and this single workpiece can be used for any number of manufactured arrays. The assumption underlying the above equation, that the substrate 10 is made of a material which is homogeneous, having equal moduli of elasticity in tension and compression, may not always be practically feasible. If a composite material is used for the substrate, for example having both ceramic and plastic portions, an accurate relationship of the chip spacing d to the temporary radius of curvature r may have to be determined empirically. Nonetheless, the above equation has been found to give a good estimate of the radius needed for a desired chip spacing d.

As an example, for a chip configuration of 15.748 mm long by 432 μm thick, and assuming a desired chip-to-chip gap d of 2 μm and an adhesive thickness under the chips of 25 μm, the temporary radius of curvature that need be obtained for substrate 10 is $$r = \frac{15.75 \times 10^{-3} m \times [0.432 \times 10^{-3} m + 0.025 \times 10^{-3} m + 1/2(1 \times 10^{-3} m)]}{2 \times 10^{-6} m}$$

$$= 7.5 m (24.6 ft)$$

For this example, the amount of temporary bow in the substrate across a 20-chip array (315 mm or 12.4 inches) would be 1.65 mm (0.065 inches).

Figure 4:
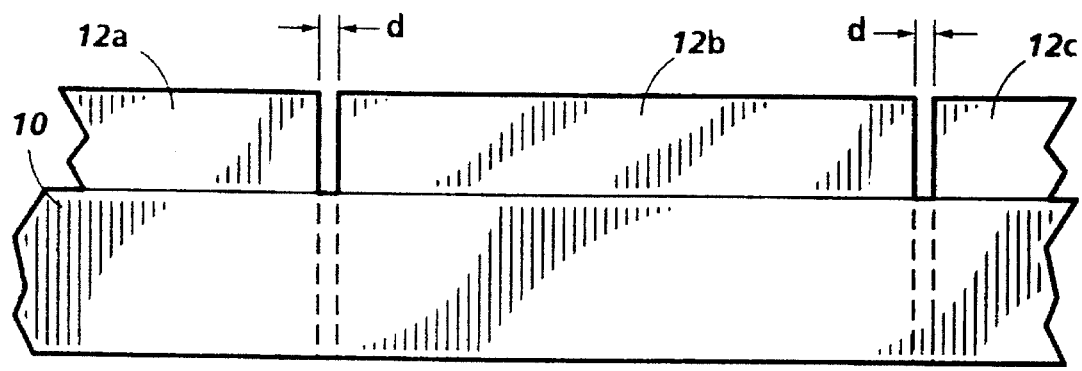
FIG. 4 is an elevational view of a chip array at another stage in the construction thereof, wherein the substrate is released from the work surface.

Once the chips $12a \ldots 12z$ are tacked onto the surface of substrate 10, the substrate 10 can be released from its urging against the work surface of workpiece 20. Typically, the substrate comprises a material which causes the substrate to reassume a straight shape when the pressure against the work surface is released. FIG. 4 shows the same adjacent chips 12a, 12b, 12c as shown in FIG. 3, after the substrate 10 is released from the work surface. Once the substrate 10 returns to its straight shape, the desired spacing d between the parallel adjacent surfaces of neighboring chips is obtained. This precise and accurate desired spacing is typically chosen to retain a spacing relationship of repetitive structures, such as photosensors or ink-jet ejectors, to retain the regularity of the spacing thereof across a multi-chip array.

While the invention has been described with reference to the structure disclosed, it is not confined to the details set forth, but is intended to cover such modifications or changes as may come within the scope of the following claims.

I claim:

1. A method of assembling a chip array having a plurality of chips spaced a distance from one another, comprising the steps of:

providing a flexible substrate;

urging the flexible substrate evenly against a work surface, the work surface defining a concave bow causing the flexible substrate to assume a radius of curvature; and tacking a plurality of chips onto the substrate with an adhesive, arranging the chips in a line whereby top corners of adjacent surfaces of adjacent chips contact each other.

2. The method of claim 1, further comprising the step of stopping urging the the flexible substrate against the work surface, causing the substrate having chips thereon to assume a straight shape.

3. The method of claim 1, wherein the tacking step includes the step of providing a discontinuous bead of liquid adhesive on the substrate, thereby avoiding accumulation of liquid adhesive between adjacent chips.

4. The method of claim 1, wherein the radius of curvature of the work surface is determined by a formula relating a dimension of each of a plurality of chips to a distance of chips spaced from one another.

5. The method of claim 1, further comprising the step of curing the adhesive.

* * * * *